(12) United States Patent
Tsukada et al.

(10) Patent No.: US 8,293,433 B2
(45) Date of Patent: Oct. 23, 2012

(54) PELLICLE FOR LITHOGRAPHY AND A METHOD FOR MAKING THE SAME

(75) Inventors: Junichi Tsukada, Annaka (JP); Toru Shirasaki, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 154 days.

(21) Appl. No.: 12/923,629

(22) Filed: Sep. 30, 2010

(65) Prior Publication Data

US 2011/0081604 A1 Apr. 7, 2011

(30) Foreign Application Priority Data

Oct. 2, 2009 (JP) ................................ 2009-230356
Oct. 30, 2009 (JP) ................................ 2009-250275

(51) Int. Cl.
*G03F 1/62* (2012.01)

(52) U.S. Cl. .......................................................... 430/5

(58) Field of Classification Search ......... 430/5; 428/14
See application file for complete search history.

(56) References Cited

U.S. PATENT DOCUMENTS

| 2005/0048376 A1* | 3/2005 | Eschbach et al. ................. 430/5 |
| 2008/0131795 A1* | 6/2008 | Gallagher et al. ................. 430/5 |
| 2009/0029269 A1 | 1/2009 | Shirasaki |

FOREIGN PATENT DOCUMENTS

| JP | H10-228098 | 8/1998 |
| JP | 2003-222990 | 8/2003 |
| JP | 2008-065258 | 3/2008 |
| JP | 2009-003111 | 1/2009 |
| JP | 2009-025562 | 2/2009 |
| JP | 2011-007935 | 1/2011 |
| JP | 2011-076037 | 4/2011 |

* cited by examiner

*Primary Examiner* — Stephen Rosasco
(74) *Attorney, Agent, or Firm* — Manabu Kanesaka

(57) ABSTRACT

There is provided a method for manufacturing a pellicle in which the pellicle frame is prepared by being heated at a predetermined temperature while constricting the frame to some extent of flatness to achieve a desired flatness and future stability against heat.

13 Claims, 2 Drawing Sheets

PELLICLE FOR LITHOGRAPHY AND A METHOD FOR MAKING THE SAME

RELATED APPLICATIONS

The present application is claims priority from Japanese Applications No. 2009-230356, filed Oct. 2, 2009 and No. 2009-250275, filed Oct. 30, 2009, the disclosure of which is hereby incorporated by reference herein in its entirety.

FIELD OF THE INVENTION

This invention concerns a pellicle for lithography used as a dust-fender for masks employed in lithographic printing to manufacture semiconductor devices such as LSI and super LSI as well as liquid crystal display board. Also the invention relates to a method for manufacturing such a pellicle which mainly consists of a frame and a transparent membrane pasted on the frame.

TECHNICAL BACKGROUND OF THE INVENTION

In manufacturing semiconductor devices such as LSI and super-LSI or in manufacturing a liquid crystal display board or the like, a pattern is made by irradiating light to a semiconductor wafer or an original plate for liquid crystal, but if a dust gets to adhere to a photo mask or a reticle (hereinafter merely referred to as a "mask" for simplicity) during the irradiation operation, the dust absorbs light or refracts it, causing deformation of a transferred pattern, roughened edges or black stains on a base, and leads to a problem of damaged dimensions, poor quality, deformed appearance and the like.

Thus, these works are usually performed in a clean room, but it is still difficult to keep the mask clean all the time. Therefore, a pellicle is attached to a surface of the mask as a dust-fender before photo irradiation is carried out. Under such circumstances, foreign substances do not directly adhere to the surface of the mask but only onto the pellicle membrane, which is sufficiently removed from the mask surface, and thus by setting a photo focus on a lithography pattern on the mask, the foreign substances on the pellicle membrane fail to transfer their shadows on the mask and thus no longer become a concern to the image transfer performance.

In general, a pellicle is built up of a pellicle frame, which is an endless frame bar, and a transparent membrane or pellicle film, the latter being tensely pasted to one of two frame faces. The membrane material is selected from cellulose nitrate, cellulose acetate, fluorine-containing polymer and the like, which transmits light (g-ray, i-ray, KrF excimer lasers, ArF excimer lasers, etc.) well, and the pellicle frame is made of aluminum, stainless, polyethylene and the like. A solvent capable of dissolving the pellicle film is applied to one of two frame faces of the pellicle frame and the pellicle film is laid onto it and the solvent is air-dried to complete the adhesion, or an adhesive such as acrylic resin, epoxy resin, fluorine-containing resin or the like is used to adhere the pellicle film onto the frame face (hereinafter this face is called "upper frame face"). The other frame face (hereinafter called "lower frame face") of the pellicle frame is laid with a pressure-sensitive adhesive layer made of polybutene resin, polyvinyl acetate resin, acrylic resin and the like for attaching the pellicle frame to a mask, and over the pressure-sensitive adhesive layer is laid a separation layer (or releaser) for protecting the pressure-sensitive adhesive layer.

The pellicle is installed in a manner such that the pellicle frame encompasses a pattern region extending on the surface of the mask. To accomplish the purpose of the pellicle which is to prevent particles from getting to the surface of the mask, the pellicle is disposed to isolate the pattern region from the external atmosphere so that particles in the external atmosphere are unable to reach the pattern region.

In recent years, the design rules for LSI have shifted toward more fineness to an order of sub-quarter micron, and this has urged shortening of the wavelengths of light sources with the result that mercury lamps for the g-line (436 nm) and i-line (365 nm) are being replaced by KrF excimer lasers (248 nm), ArF excimer lasers (193 nm) and the like. As required fineness is further increased, the flatness required of masks and silicon wafers is increased too.

The pellicle is attached to the mask for the purpose of fending particles off the pattern region only after the preparation of the mask is completed. It happens occasionally that when the pellicle is attached to the mask, the flatness of the mask is changed. If the mask flatness is lowered, problems such as de-focusing may take place. Also, when the mask flatness is lowered, the pattern configuration laid on the mask deviates from the original configuration, and a correct alignment is not obtained when masks are put assembled.

There are a number of causes that lead to change in the flatness of the mask, and it has been found that the most influential one is the comparatively poor flatness of the pellicle frame.

In recent years, the requirement for higher flatness of the mask has been strengthened from a flatness of 2 micrometers in the pattern region face, and since the time 65 nm node was introduced, a flatness of 0.5 micrometer or lower, or preferably 0.25 micrometer is required of the pattern face.

The Problems the Invention Seeks to Solve

In general the flatness of pellicle frame is only in the level of 20-80 micrometers, and when the pellicle having such flatness level, which is incomparable to that of mask, is attached to the mask, the pellicle's poverty in flatness is transferred to the mask whereby the mask is deformed. The pellicle is pressed to the mask under a high pressure of about 200-400 N (20-40 kg). The surface of mask is far flatter than the pellicle frame. Thus, after the forced attachment onto the mask, the pellicle frame starts straining itself to return to its original form, whereby the mask is caused to deform.

When the mask is deformed the flatness of the mask is often ill-affected, and this in turn causes the problems such as defocusing in the lithography equipment. On the other hand there are cases wherein the flatness of the mask is improved as the mask is deformed, but in such cases the pattern made in the mask surface is distorted, and as a result when the light is irradiated the pattern transferred to the wafer can be distorted too. This distortion of the pattern on the wafer also occurs in the cases where the flatness of the masks is degraded, so that in any case wherein the mask is deformed as the pellicle is pressed on it, the pattern transferred to the wafer is invariably distorted.

In order to solve this problem, there have been developed pellicle frames having higher flatness. However, in the environments wherein the pellicle is attached to the mask as well as wherein the pellicle frame is manufactured, the pellicle is subjected to physical force and heat, and the flatness of the pellicle frame is vulnerable to such influences especially temperature change. Therefore, the pellicle frame need be prepared against such influences.

SUMMARY OF THE INVENTION

To solve such problems described above, the present invention firstly proposes a method of manufacturing a pellicle whereby the deformation of the masks caused by the pellicle frame as the pellicle frame is attached to the mask is minimized. Secondly, the present invention provides a pellicle manufactured by such a method.

Means to Solve the Problems

The present inventors worked to find ways to solve the problems and came to possess the invention according to which:

(1) in making a pellicle having a frame with a first frame face to which a pellicle membrane is tensely pasted and a second frame face on which a pressure sensitive adhesive layer is laid, the frame is prepared by being subjected to a heat treatment at a predetermined temperature while being constricted between a pair of flat surfaces set against said first and second frame faces;

in an embodiment, the pellicle frame is laid on a flat surface with the second frame face in contact with the flat surface and the first frame face topped with a cover plate, and the frame is subjected to the preparatory heat treatment at the predetermined temperature, whereby the pellicle can substantially avoid undergoing frame deformation during later environmental temperature changes; and more preferably (2) the pellicle frame is subjected to a preliminary heat treatment at a predetermined temperature while being constricted between a pair of flat surfaces pressed on the frame faces by means of a load, whereby the pellicle can substantially avoid undergoing frame deformation during later environmental temperature changes.

The inventors found that some of the resulting pellicle frames retained flatness of 3 micrometers or higher after the later thermal influences.

The inventors also found that the temperature for the preliminary heat treatment is preferably 140-250° C.

The inventors found that preferably the material for the pellicle frame is one that has a Young's modulus of 1-80 GPa.

Moreover, the inventors found a preferred material for the pellicle frame is an aluminum alloy.

Thus the present invention also provides a pellicle with a frame and a membrane pasted on one frame face of the frame and a pressure-sensitive adhesive layer laid on the other frame face for chucking the pellicle on a mask wherein the frame is pre-heated so that the pellicle does not undergo deformation during later hot environment.

According to the invention, it is possible to effectively obtain a pellicle frame having a flatness of 15 micrometers or smaller, and thus it is possible to minimize the deformation of the masks caused by the pellicle frame as the pellicle frame is attached to the mask.

DETAILED DESCRIPTION OF THE INVENTION

Now, the present invention will be explained with reference to drawings.

Figure 1:
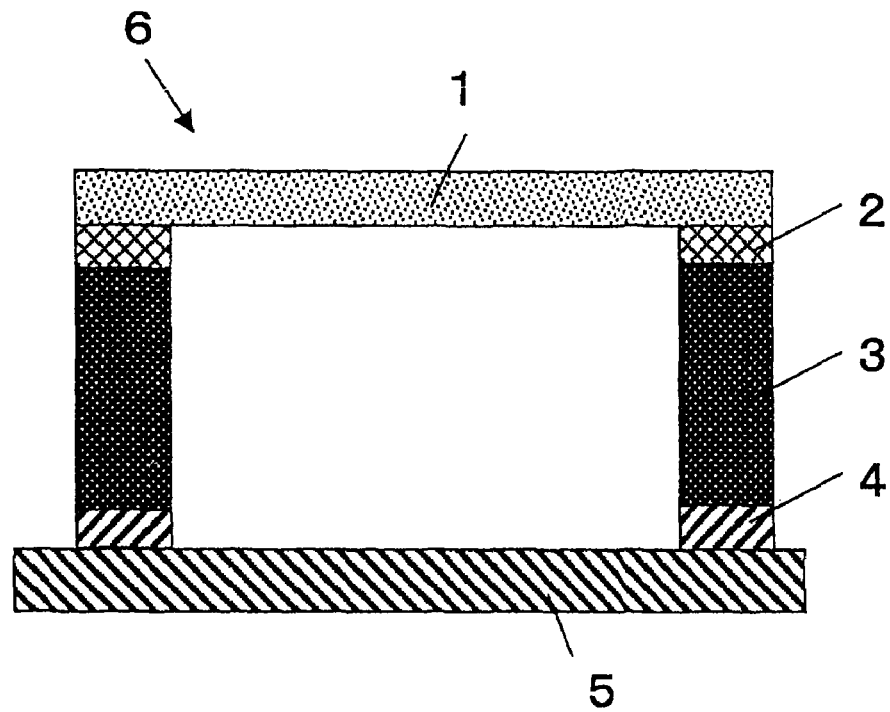
FIG. 1 is a conceptual sectional view of an example of a pellicle plus mask.

As shown in FIG. 1, a pellicle 6 for lithography according to the invention comprises a pellicle membrane 1 and a frame 3. The pellicle membrane 1 is pasted on one of two frame faces of the frame 3 via an adhesive 2 laid on said one of the frame faces. On the other frame face is laid a pressure-sensitive adhesive layer 4 for attaching the frame 3 to a mask 5, and over the pressure-sensitive adhesive layer is laid a separation layer or releaser (not shown), which is released prior to the attachment of the frame 3 on the mask 5. A pellicle frame may be formed with a penetrating hole (no shown) to communicate the closed space defined by the pellicle and the mask to the atmosphere to thereby adjust the pressure inside said space. In addition, a filter for dust trapping may be provided inside the hole.

The pellicle frame may be formed with a jig hole. The configuration of the jig hole is not limited and may have a tapered recess at the end of the cylindrical hollow, so long as the jig hole extends horizontally to the frame faces and does not penetrate the frame bar. It is preferable that the cross section of the jig hole as cut by plane perpendicular to the hole axis is expanded at the external hole exit so that the hole has a recess to receive a filter for trapping the dust at its external exit.

The pellicle frame of the present invention shall be designed in accordance with the mask configuration, and in general the pellicle frame has a shape of circle, rectangle or square, and has such a width and configuration to entirely cover the circuit pattern area provided on the surface of the mask. The corners of a rectangular frame and square frame may be rounded.

The height of the pellicle frame, that is the distance between the upper frame face and the lower frame face, is preferably about 1-10 mm, and more preferably about 2-7 mm. The widths of the upper and lower frame faces, that is the distance between the inner wall and the outer wall of the pellicle frame not at the corners, is preferably 1-5 mm, and more preferably 2 mm.

As a material to make the pellicle frame, one having a Young's modulus of 1-80 GPa, such as aluminum alloy, magnesium alloy, and synthetic resin, is preferred, of which aluminum alloy is more preferred.

As for the choice from aluminum alloys, ones conventionally used to make pellicle frame are possible, and ones more preferred include JIS A7075, JIS A6061, JIS A5052 and the like, but so long as it is possible to form a frame with a cross section described above and with a strength required for a pellicle frame, there is no other qualification.

It is preferable to roughen the surface of the pellicle frame with sand blast or chemical washing prior to attachment of the membrane. In the present invention, it is acceptable to adopt any conventionally known method for roughening the frame surface.

A preferred choice, in the case of aluminum alloy frame, to roughen the frame surface is to blast the frame surface with grains of stainless steel or carborundum, or glass beads, and then wash the surface with a chemical such as NaOH.

It is also preferable to choose a material having a Young's modulus of 1-50 GPa to make a pellicle frame of the present invention in place of conventionally chosen aluminum alloys such as JIS A7075, JIS A6061, and JIS A5052, which have a Young's modulus of 69 GPa or so. Examples of materials having a Young's modulus in the range of 1 to 50 GPa include magnesium alloy (44 GPa), acrylic resin (3 GPa) and polycarbonate resin (2.5 GPa).

In the present invention, it is preferable that the endless frame bar is chamfered such that its cross section, taken as in FIG. 1, becomes a rounded rectangle along the entire length of the frame bar. It is possible to chamfer only along the lower frame face or only along the upper frame face.

The flatness of an average pellicle frame is about 20-80 micrometers. In the present invention it is preferable that the pellicle frame has a flatness of 20 micrometers or higher, that is, less than 80 micrometers.

The higher the flatness of the pellicle frame, the smaller the deformation of the pellicle frame as the pellicle is attached to the mask. This results in lower flow stress in the pellicle frame, and decreased mask deformation.

The flatness of pellicle frame is defined as follows. The heights of eight points, four at the four corners and four at the middle parts of the four straight portions of the frame bar, are measured; from the result an imaginary plane is created by calculation, and of the distances of the eight points from the imaginary plane, the smallest value is subtracted from the largest value, and the result is the flatness.

In obtaining the flatness of the pellicle frame, a laser displacement sensor having an X-Y axis program stage can be used, and the inventors had one originally made inside the company and used it. In practicing the present invention, it is preferable that the pellicle frame is coated with a black oxide film and/or black polymer film since the pellicle frame absorbs stray light. Also, in the case where the pellicle frame is made of an aluminum alloy, it is especially proper to coat the pellicle frame with a black almite (alumite) film and/or polymer film by electro deposition.

A method, used generally, for creating a black almite film on the pellicle frame surface comprises first treating the pellicle frame in a bath of an alkali such as NaOH for several tens of seconds, conducting anodic oxidation in a dilute sulfuric acid, coloring in black, and finally sealing the frame surface, whereby the frame surface changes to a black almite.

The polymer film (polymer coating) can be created in various ways such as spray coating, electrostatic coating, and electro deposition, among which electro deposition is most preferable for polymer film creating.

The electro deposition is applicable to both thermosetting resin and ultraviolet curable resin. Also anionic electro deposition and cationic electro deposition are applicable to both of the resins. Since in the present invention an ultraviolet resistibility is required so that anionically electro-deposited thermosetting resin is preferable in the viewpoints of stability, appearance and strength of the coating.

The pellicle for lithography of the present invention can be completed, using any one of the pellicle frames described above, by tensely pasting a pellicle membrane on the upper frame face via an adhesive for pellicle membrane and laying an adhesive for mask on the lower frame face topped with a releaser.

The material of which the pellicle film or membrane is made can be anything conventionally used; for example, an amorphous fluorine-containing polymer which is used for excimer laser may be adopted. Examples of amorphous fluorine-containing polymer include Cutup (a product of Asahi Glass Co., Ltd.), TEFLON (a trademark), and AF (a product of Du Pont). To make a film from such polymers, one of the polymers may be dissolved in a solvent such as fluoro-philic solvent.

Figure 2:
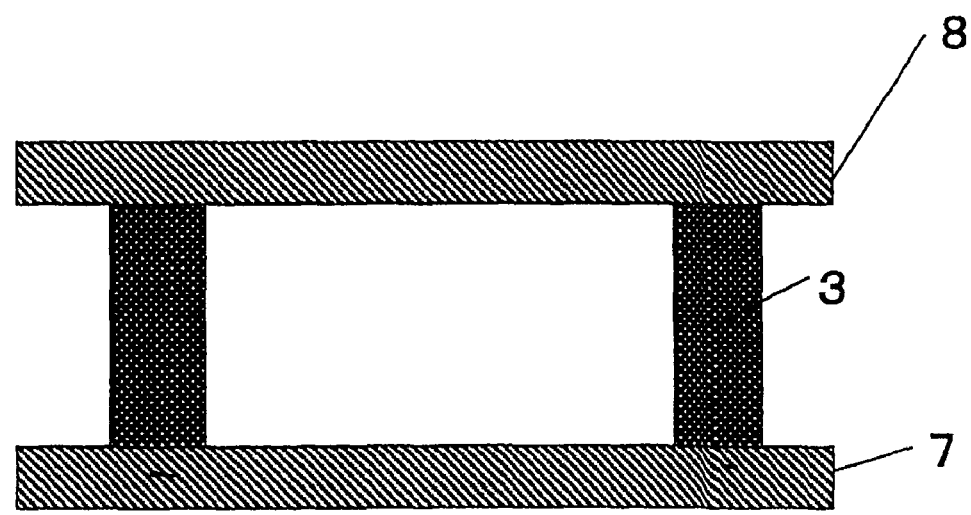
FIG. 2 is a conceptual sectional view illustrating an example of a step of the present invention which is conducted while the pellicle frame is subjected to the heat treatment.

Next, a method of making the pellicle frame according to the present invention will be explained with reference to FIG. 2. As shown in FIG. 2, a pellicle frame 3 is placed on a base plate 7, such as a quartz glass plate, with the lower frame face, on which a pressure-sensitive adhesive layer is later laid for chucking the frame on a mask, touching the base plate 7, and a cover plate 8, such as a quartz glass plate, is placed on the upper frame face of the pellicle frame 3 on which an adhesive layer for pasting the pellicle membrane is later laid. Then a heat treatment according to the invention is conducted.

The base plate 7 has flat upper and lower faces, and should have a flatness of 5 micrometers or higher.

The cover plate 8 is used to cover the upper frame face during the heat treatment. The cover plate 8 also is required to have flat upper and lower faces. An example is a quartz glass plate having a mass of 0.3 kg and a thickness of 6 mm.

In a preferred embodiment, a weight body is laid on the cover plate 8, so that the cover plate 8 must have a reasonably high flatness to enable the weight of the weight body to evenly distribute on the top frame face of the pellicle frame 3. The load upon the pellicle frame can exceed about 196 N (20 kg), but beyond 196 N the improvement in the resulting frame flatness is not justifiable. Without the load, and hence only the weight of the cover plate 8 is imposed on the pellicle frame, it takes a longer time to attain a result in the flatness of the pellicle frame 3. Thus, a load of about 4.90 to about 196 N (0.5-20 kg) is preferable.

For the weight body, a lead plate, a standard weight, a compact weighty article, etc. will do.

The heat treatment at a predetermined temperature can be applied to the pellicle frame through an electro-conductive heater wound round the pellicle frame bar, or through radiation of an infrared rays to the frame, for example. It is also possible to heat-treat the pellicle frame by increasing the temperature of a system to a predetermined temperature in which the pellicle frame is kept.

It is preferable that the predetermined temperature for the heat treatment is 140-250° C. If the temperature at which the pellicle frame is heat-treated is lower than 140° C., the expected effect of reducing the thermal deformation is not obtainable. If the temperature is higher than 250° C., the frame surface tends to crack and discolor.

EXAMPLES

Now, examples of embodying the present invention will be explained, but the concept of the invention shall not be limited to the examples.

Pellicles frames with an outer dimension of 149 mm×122 mm, the frame bar being 3.5 mm high and 2 mm wide, were made out of an aluminum alloy, and they had a flatness of about 15 micrometers. The four corners of each pellicle frame were rounded by chamfering.

Example 1

On one face of a quartz glass plate 7 having a flatness of 5 micrometers or less was placed an above-described pellicle frame 3 with the lower frame face thereof being in contact with the plate 7, and the upper frame face of the pellicle frame was topped by a quartz glass plate 8 (FIG. 2). This assembly was heated for two hours in an oven at a temperature of 250° C., and the flatness of the lower frame face of the frame 3 was measured. Thereafter, the pellicle frame 3 was hung from a glass hook inside an oven, and was heat-treated at 250° C. for 20 minutes; then the flatness was measured again.

Example 2

On one face of a quartz glass plate 7 having a flatness of 5 micrometers or less was placed another one of above-described pellicle frame with the lower frame face thereof being in contact with the plate 7, and the upper frame face of the pellicle frame was topped by a quartz glass plate. This assembly was heated for two hours in an oven at a temperature of 185° C., and the flatness of the lower frame face of the frame 3 was measured. Thereafter, the pellicle frame 3 was hung from a glass hook inside an oven, and was heat-treated at 250° C. for 20 minutes; then the flatness was measured again.

Example 3

On one face of a quartz glass plate 7 having a flatness of 5 micrometers or less was placed another of above-described pellicle frame with the lower frame face thereof being in contact with the plate 7, and the upper frame face of the pellicle frame was topped by a quartz glass plate. This assembly was heated for two hours in an oven at a temperature of 185° C., and the flatness of the lower frame face of the frame 3 was measured. Thereafter, the pellicle frame 3 was hung from a glass hook inside an oven, and was heat-treated at 185° C. for 20 minutes; then the flatness was measured again.

Example 4

On one face of a quartz glass plate 7 having a flatness of 5 micrometers or less was placed still another of above-described pellicle frame with the lower frame face thereof being in contact with the plate 7, and the upper frame face of the pellicle frame was topped by a quartz glass plate. This assembly was heated for two hours in an oven at a temperature of 140° C., and the flatness of the lower frame face of the frame 3 was measured. Thereafter, the pellicle frame was hung from a glass hook inside an oven, and was heat-treated at 185° C. for 20 minutes; then the flatness was measured again.

Example 5

On one face of a quartz glass plate 7 having a flatness of 5 micrometers or less was placed yet another of above-described pellicle frame with the lower frame face thereof being in contact with the plate 7, and the upper frame face of the pellicle frame was topped by a quartz glass plate. This assembly was heated for two hours in an oven at a temperature of 140° C., and the flatness of the lower frame face of the frame 3 was measured. Thereafter, the pellicle frame 3 was hung from a glass hook inside an oven, and was heat-treated at 140° C. for 20 minutes; then the flatness was measured again.

Comparative Example 1

An above-described pellicle frame was hung from a glass hook inside an oven, and was heat-treated at 250° C. for 20 minutes; then the flatness of one of the frame faces was measured.

Comparative Example 2

An above-described pellicle frame was hung from a glass hook inside an oven, and was heat-treated at 185° C. for 20 minutes; then the flatness of one of the frame faces was measured.

Comparative Example 3

An above-described pellicle frame 3 was hung from a glass hook inside an oven, and was heat-treated at 140° C. for 20 minutes; then the flatness of one of the frame faces was measured.

The results of flatness measurements are entered in Table 1 below.

TABLE 1

| | 1st heat treatment temperature | 2nd heat treatment temperture (° C.) | flatness (micrometer) | |
| --- | --- | --- | --- | --- |
| | | | before 2nd heat treatment | after 2nd heat treatment |
| Example 1 | 250 | 250 | 14 | 16 |
| Example 2 | 185 | 250 | 15 | 16 |
| Example 3 | 185 | 185 | 15 | 15 |
| Example 4 | 140 | 185 | 17 | 20 |
| Example 5 | 140 | 140 | 15 | 17 |
| Comparative Example 1 | none | 250 | 16 | 79 |
| Comparative Example 2 | none | 185 | 15 | 48 |
| Comparative Example 3 | none | 140 | 16 | 31 |

Pellicles frames 10 with an outer dimension of 149 mm×122 mm, the frame bar being 3.5 mm high and 2 mm wide, were made out of an aluminum alloy. The four corners of each pellicle frame were rounded by chamfering.

Example 6

Figure 3:
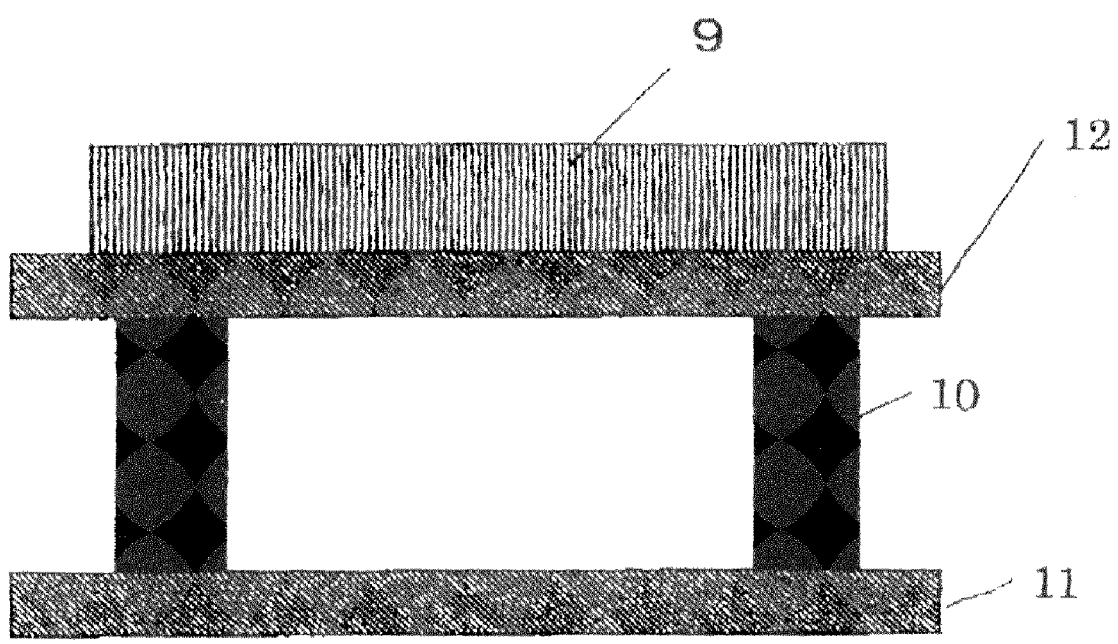
FIG. 3 is a conceptual sectional view illustrating an example of a step of the present invention which is conducted while the pellicle frame is constricted between a pair of flat surfaces and the pellicle frame is subjected to the heat treatment.

On one face of a quartz glass plate 11 having a flatness of 3 micrometers was placed an above-described pellicle frame 10 with the lower frame face thereof being in contact with the plate 11, and the upper frame face of the pellicle frame 10 was topped by a quartz glass plate 12 (FIG. 3). A weight 9 of 2 kg was laid on the quartz glass plate 12. This assembly was heated for two hours in an oven at a temperature of 185° C., and the flatness of the lower frame face of the frame 10 was measured.

Example 7

On one face of a quartz glass plate 11 having a flatness of 3 micrometers was placed an above-described pellicle frame 10 with the lower frame face thereof being in contact with the plate 11, and the upper frame face of the pellicle frame 10 was topped by a quartz glass plate 12. A weight of 2 kg was laid on the quartz glass plate 12. This assembly was heated for two hours in an oven at a temperature of 140° C., and the flatness of the lower frame face of the frame 10 was measured.

Example 8

On one face of a quartz glass plate 11 having a flatness of 3 micrometers was placed an above-described pellicle frame 10 with the lower frame face thereof being in contact with the plate 11, and the upper frame face of the pellicle frame 10 was topped by a quartz glass plate 12. A weight of 2 kg was laid on the quartz glass plate 12. This assembly was heated for two hours in an oven at a temperature of 250° C., and the flatness of the lower frame face of the frame 10 was measured.

Example 9

On one face of a quartz glass plate 11 having a flatness of 3 micrometers was placed an above-described pellicle frame 10 with the lower frame face thereof being in contact with the plate 11, and the upper frame face of the pellicle frame 10 was topped by a quartz glass plate 12. A weight of 2 kg was laid on the quartz glass plate 12. This assembly was heated for 20 minutes in an oven at a temperature of 185° C., and the flatness of the lower frame face of the frame 10 was measured.

Example 10

On one face of a quartz glass plate 11 having a flatness of 3 micrometers was placed an above-described pellicle frame 10 with the lower frame face thereof being in contact with the plate 11, and the upper frame face of the pellicle frame 10 was topped by a quartz glass plate 12. A weight of 2 kg was laid on the quartz glass plate 12. This assembly was heated for 15 hours in an oven at a temperature of 185° C., and the flatness of the lower frame face of the frame 10 was measured.

Example 11

On one face of a quartz glass plate 11 having a flatness of 3 micrometers was placed an above-described pellicle frame 10 with the lower frame face thereof being in contact with the plate 11, and the upper frame face of the pellicle frame 10 was topped by a quartz glass cover plate 12. A weight of 0.5 kg was laid on the cover plate 12. This assembly was heated for 15 hours in an oven at a temperature of 185° C., and the flatness of the lower frame face of the frame 10 was measured.

Example 12

On one face of a quartz glass plate 11 having a flatness of 3 micrometers was placed an above-described pellicle frame 10 with the lower frame face thereof being in contact with the base plate 11, and the upper frame face of the pellicle frame 10 was topped by a quartz glass plate 11. A weight of 20 kg was laid on the cover plate. This assembly was heated for two hours in an oven at a temperature of 185° C., and the flatness of the lower frame face of the frame 10 was measured.

Comparative Example 4

On one face of a quartz glass base plate having a flatness of 3 micrometers was placed an above-described pellicle frame 10 with the lower frame face thereof being in contact with the base plate, and the upper frame face of the pellicle frame 10 was topped by a quartz glass cover plate. A weight of 2 kg was laid on the cover plate. This assembly was stored for 2 hours in an oven at the room temperature, and the flatness of the lower frame face of the frame 10 was measured.

Comparative Example 5

On one face of a quartz glass base plate 11 having a flatness of 15 micrometers was placed an above-described pellicle frame 10 with the lower frame face thereof being in contact with the base plate, and the upper frame face of the pellicle frame 10 was topped by a quartz glass cover plate 12. A weight of 2 kg was laid on the cover plate. This assembly was heated for 2 hours in an oven at a temperature of 185° C., and the flatness of the lower frame face of the frame 10 was measured.

The results of flatness measurements are as shown in Table 2 below.

TABLE 2

Heat treatment conditions and the measurement results of Examples and Comparative Examples

| | heat treatment conditions | | | | flatness measured | |
|---|---|---|---|---|---|---|
| | quartz glass plate flatness (micrometer) | temperature (° C.) | load (kg) | time (hr) | before 2nd heat treatment | after 2nd heat treatment |
| Example 1 | 3 | 185 | 2 | 2 | 24 | 12 |
| Example 2 | 3 | 140 | 2 | 2 | 21 | 15 |
| Example 3 | 3 | 250 | 2 | 2 | 24 | 11 |
| Example 4 | 3 | 185 | 2 | 0.2 | 19 | 15 |
| Example 5 | 3 | 185 | 2 | 15 | 18 | 9 |
| Example 6 | 3 | 185 | 0.5 | 15 | 20 | 15 |
| Example 7 | 3 | 185 | 20 | 2 | 23 | 10 |
| Comparative Example 1 | 3 | 20 | 2 | 2 | 24 | 24 |
| Comparative Example 2 | 15 | 185 | 2 | 2 | 23 | 22 |

What is claimed is:

1. A method for manufacturing a pellicle having a pellicle frame with a first frame face to which a pellicle membrane is tensely pasted and a second frame face on which a pressure sensitive adhesive layer is laid,
wherein said pellicle frame is prepared by being subjected to a heat treatment at a predetermined temperature while being constricted between a pair of parallel flat surfaces of plates set against said first and second frame faces.

2. The method for manufacturing a pellicle according to claim 1, wherein a flatness of one of said flat surfaces of the plates that is in contact with the second frame face is 5 micrometers or smaller.

3. The method for manufacturing a pellicle according to claim 2, wherein said flatness is 3 micrometers or smaller.

4. The method for manufacturing a pellicle according to claim 1, wherein said predetermined temperature is in a range of 140-250° C.

5. The method for manufacturing a pellicle according to claim 1, wherein the pellicle frame is made of a material having a Young's modulus of 1-80 GPa.

6. The method for manufacturing a pellicle according to claim 5, wherein the pellicle frame is made of an aluminum alloy.

7. The method for manufacturing a pellicle according to claim 1, wherein the pellicle frame is constricted by a load of about 4.90- about 196 N.

8. The method for manufacturing a pellicle according to claim 1, wherein
the second frame face is placed on a base plate first, and
a weight is placed on the pellicle frame on a side that the first frame face is present after the second frame face is placed on the base plate.

9. The method for manufacturing a pellicle according to claim 8, further comprising another heat treatment after the heat treatment for a shorter time than the heat treatment.

10. The method for manufacturing a pellicle according to claim 9, wherein a surface of the pellicle frame is roughen prior to an attachment of the pellicle membrane.

11. The method for manufacturing a pellicle according to claim 9, wherein the another heat treatment is made by hanging the pellicle frame from a hook inside an oven.

12. The method for manufacturing a pellicle according to claim 8, wherein the base plate is a quartz glass plate.

13. The method for manufacturing a pellicle according to claim 1, wherein a distance between an upper frame face and a lower frame face of the pellicle frame is 1-10 mm.

* * * * *